(12) United States Patent
Martin

(10) Patent No.: US 8,188,883 B2
(45) Date of Patent: May 29, 2012

(54) UTILITY METER WITH COMMUNICATION SYSTEM DISPLAYS

(75) Inventor: Warren T. Martin, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 1276 days.

(21) Appl. No.: 11/861,613

(22) Filed: Sep. 26, 2007

(65) Prior Publication Data

US 2008/0088475 A1 Apr. 17, 2008

Related U.S. Application Data

(60) Provisional application No. 60/847,721, filed on Sep. 28, 2006.

(51) Int. Cl.
*G08C 15/06* (2006.01)
(52) U.S. Cl. ............... 340/870.02; 710/48; 713/186
(58) Field of Classification Search ............ 340/870.02; 713/186; 700/291
See application file for complete search history.

(56) References Cited

U.S. PATENT DOCUMENTS

| 6,512,463 | B1 * | 1/2003 | Campbell et al. ....... 340/870.02 |
| 2002/0077729 | A1 * | 6/2002 | Anderson ................... 700/291 |
| 2007/0055889 | A1 * | 3/2007 | Henneberry et al. ........ 713/186 |

* cited by examiner

*Primary Examiner* — Timothy Edwards, Jr.
(74) *Attorney, Agent, or Firm* — Maginot, Moore & Beck

(57) ABSTRACT

A utility meter comprises a measurement circuit configured to measure commodity consumption and provide consumption data. A memory in the meter is configured to store meter data including the consumption data. The memory includes a plurality of memory segments, each of the plurality of memory segments protected by a different password. The meter further comprises a receiver configured to receive a memory request and an associated password from a source external to the utility meter. A controller in the meter is configured to grant or deny the memory request depending upon the associated password received from the source external to the utility meter.

20 Claims, 8 Drawing Sheets

UTILITY METER WITH COMMUNICATION SYSTEM DISPLAYS

CROSS-REFERENCE TO RELATED APPLICATIONS

This application claims the benefit of earlier filed U.S. provisional application No. 60/847,721, filed Sep. 28, 2006.

FIELD

This application relates to the field of utility metering, and more particularly, to utility meters having external communications capability.

BACKGROUND

Utility meters typically include a metering circuit that is capable of measuring some aspect of a consumed commodity and a display that provides visual information regarding the measured consumption. For example, in electricity meters, a metering circuit measures electrical energy delivered to a customer or load, and the display provides visual information regarding the measured energy data. While many simple meters continue to use rotating disks and mechanical displays, many newer meters employ electronic displays such as LCD or LED displays.

In meters having electronic displays, the meter is programmed to display information generated within the metering circuit. To this end, the metering circuit may write data to memory in certain locations and in a certain way, and then a processing circuit (which may be part of the metering circuit) displays the data written to the memory locations in a predetermined sequence according to a standard meter display routine.

The standard meter display routine specifies what meter data will be displayed and in what format. The data that may be displayed by a typical utility meter with and electronic display is limited to the data that is generated by the meter or otherwise contained within the meter. Although some meters are configurable, the meter is typically only configurable to the extent that the display functionality is selected from a set of functions supported by the meter's firmware. When the meter is configured for use in the field, a meter operator, such as a utility employee, selects certain functions and parameters for the meter's standard display routine from a set of standard functions and parameters pre-programmed into the firmware of the meter. Once the meter is in the field, the meter may be re-configured to alter the meter display routine by selecting additional or different functions, data, or parameters found within the meter. However, the display of the meter is limited to the meters existing programming, and typical meters are not equipped to display data from a source external to the meter and/or with functions and parameters not found in the meter firmware. The meter's display limitations reduce the overall functionality of the meter and ability to work effectively with remote sources external to the meter.

Accordingly, it would be advantageous to provide a utility meter that provides the ability to display a message received from a remote source outside of the utility meter after the meter is placed in the field. In addition, it would also be advantageous to provide a utility meter that can deliver data to a remote location for processing and receive processed or compiled data in return that may then be displayed by the utility meter. It would also be advantageous if such a utility meter included protection measures to ensure that only certain parties have certain limited abilities to alter the meter's display.

SUMMARY

As disclosed herein, a utility meter comprises a measurement circuit configured to measure commodity consumption and provide consumption data. A memory in the meter is configured to store meter data including the consumption data. The memory includes a plurality of memory segments, each of the plurality of memory segments protected by a different password. The meter further comprises a receiver configured to receive a memory request and an associated password from a source external to the measurement circuit or the utility meter. A controller in the meter is configured to grant or deny the memory request depending upon the associated password received from the source external to the utility meter. The plurality of memory segments may include, for example, a segment dedicated to passwords, a segment dedicated to metrology data, and a segment dedicated to AMR data, as well as other segments.

In at least one embodiment, the utility meter comprises a meter display configured to display the meter data stored in the memory according to a standard meter display routine. In such an embodiment, the controller is configured to interrupt or override the standard meter display routine when the memory request is accepted and the memory request includes an associated display instruction that is different from the standard meter display routine. The display instruction may include an instruction to display data already stored in the memory or data received from the remote source. In one embodiment, the controller is configured to return to the standard meter display routine following a predetermined time after communication with the source external to the utility meter ends.

The above described features and advantages, as well as others, will become more readily apparent to those of ordinary skill in the art by reference to the following detailed description and accompanying drawings. While it would be desirable to provide a utility meter that provides one or more of the above-mentioned advantageous features, or other advantages as may be apparent to those reviewing this disclosure, the teachings disclosed herein extend to those embodiments which fall within the scope of the appended claims, regardless of whether they accomplish one or more of the above-mentioned features or advantages.

DESCRIPTION

Various embodiments of a utility meter with novel display capabilities are disclosed herein. According to at least one first embodiment, the display capability of an electricity meter is expanded by allowing alternative device display control that overrides the ordinary display program within the meter. The alternative or instant device display control may be activated through an external communication interface such as an optical port in the meter housing or an automatic meter reading ("AMR") device such as a radio, power line modem, or land-line modem.

In another embodiment, the meter memory includes locations reserved for access by different users or devices having different passwords. The metering processor can perform display operations using information from the different user-allocated memory locations.

Although various embodiments of a utility meter are disclosed herein, it will be recognized that features from various embodiments may be combined in an advantageous manner.

Figure 1:
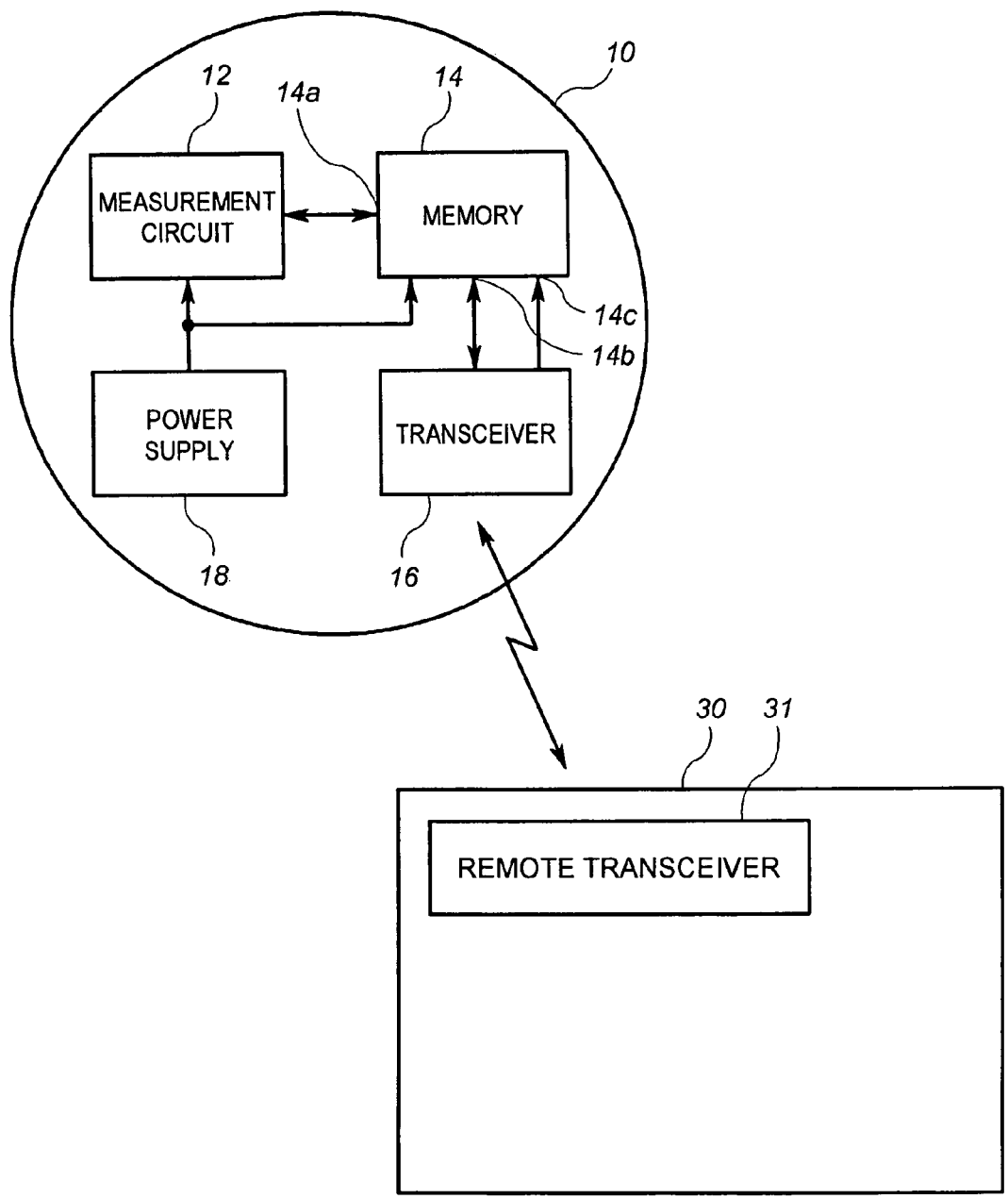
FIG. 1 shows an exemplary utility meter arrangement in communication with a remote communication device.

With reference now to the drawings, FIG. 1 shows an exemplary utility meter 10 configured for operation according to the present invention and an exemplary remote source 30 external to the utility meter but in contact therewith. In general the remote source 30 is configured to communicate data to and/or from the utility meter 10. The utility meter 10 includes metrology circuitry in the form of a measurement circuit 12, a memory 14, a communication device, such as a transceiver 16, and a power supply 18. It will be appreciated that the utility meter 10 may optionally include other devices such as other communication circuitry, an electronic or mechanical display, and other peripheral devices commonly available in utility meters.

The exemplary remote source 30 includes a transceiver 31 and is operable to transmit data to or receive data from the utility meter 10. Accordingly, the remote source may transmit data through a wireless transmission or via a wired connection, such as an internet connection. The remote source is external to the utility meter, and may be any of numerous sources, such as, for example, a handheld transmission device, a mobile computer, or a stationary computer located at particular location, such as the offices or production plant of a utility.

Referring specifically to the utility meter 10, the measurement circuit 12 is a circuit that generates utility data. The utility data may be in the form of digital signals, such those as used within processing circuitry, or may include pulses representative of a particular quantity of commodity consumed. For example, in water and gas meters, circuitry connected to flow metering devices generate pulse signals, each of which represents a certain amount of flow. In electricity meters, the measurement circuit 12 may include one or more processing devices that calculate energy consumption data from measured current and voltage signals. Measurement circuits used in electricity, gas and water metering are known in the art.

The memory 14 in the exemplary embodiment of FIG. 1 is a non-volatile memory that retains data even in the absence of electrical bias power. Thus, the non-volatile memory 14 may be an electrically erasable programmable read-only memory ("EEPROM"). The non-volatile memory 14 is operably coupled to communicate data to and/or from the measurement circuit 12. The non-volatile memory 14 is further operable to communicate data to and from the meter transceiver 16. To this end, the non-volatile memory includes multiple communication ports, specifically a first port 14a coupled to the measurement circuit and a second port 14b coupled to the meter transceiver 16. The power supply 18 is a device that generates bias power for the measurement circuit 12. In one example, the power supply 18 may be connected to the mains electrical power lines and generate bias power for the measurement circuit. However, the power supply 18 may alternatively derive power from batteries, light sources or the like. In accordance with embodiments of the present invention, the power supply 18 provides the power necessary to allow data communication between the measurement circuit 12 and the non-volatile memory 14. The meter transceiver 16 is a transceiver circuit that is configured to receive a signal from an external source, obtain energy from the signal, and convert the energy to bias power for use by the non-volatile memory 14. To this end, the meter transceiver 16 is connected to a bias power input 14c of the non-volatile memory 14. In addition, the meter transceiver 16 is operable to perform a data transfer operation responsive to the signal, the data transfer operation including a transfer of data between the non-volatile memory 14 and the meter transceiver 16 using the second port 14b of the non-volatile memory 14.

The transceiver 16 is, for example an RF transceiver, and thus is operable to perform the above-described functions upon receiving an RF signal.

Figure 2:
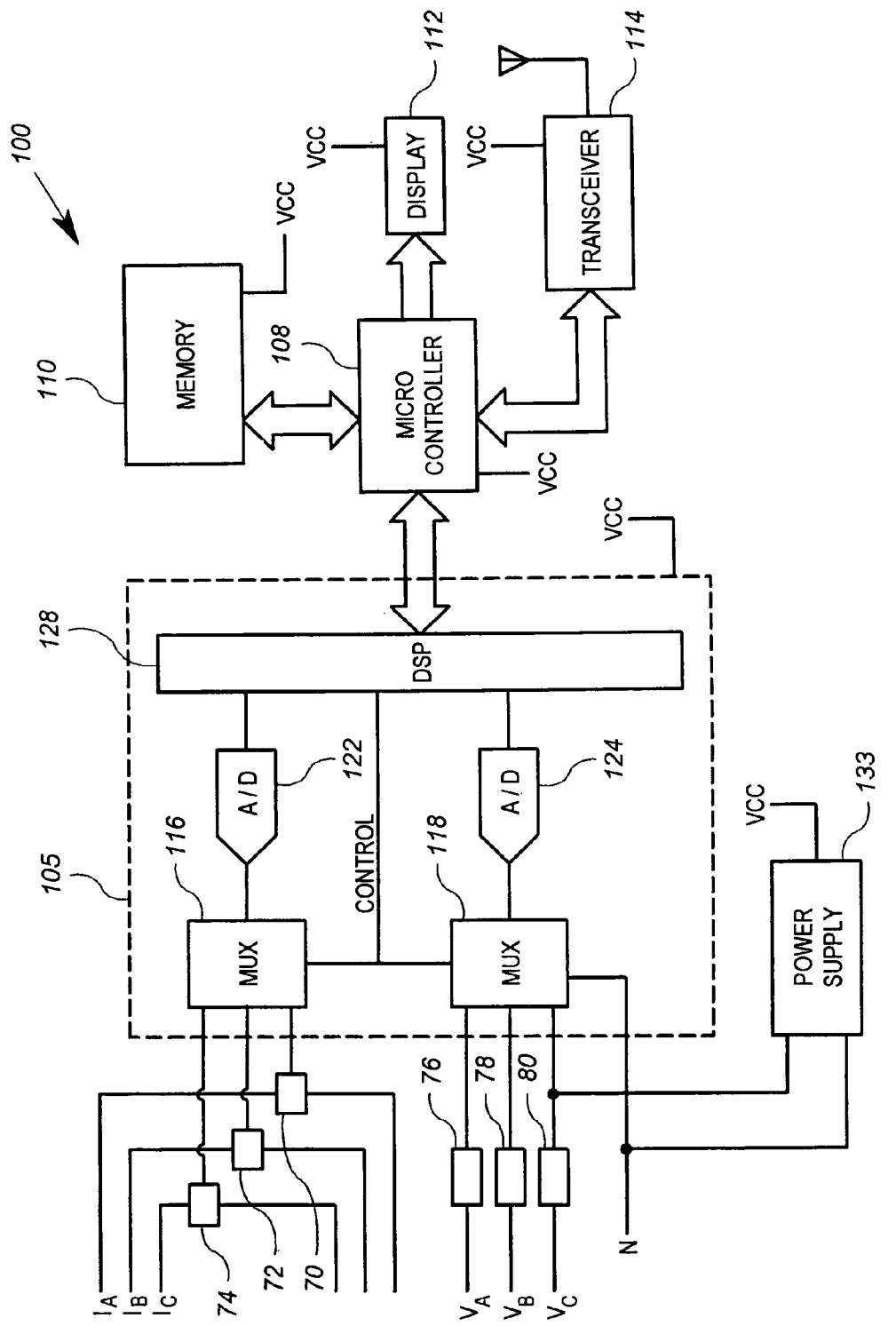
FIG. 2 shows an exemplary embodiment of the utility meter of FIG. 1, the meter including a memory, a processor, a display, and a transceiver.

FIG. 2 shows a more detailed view of an exemplary electricity meter 100 configured for use according to at least one embodiment of the present invention. The electricity meter 100 shows in further detail one example of the meter 10 shown in FIG. 1.

Referring now to FIG. 2, a schematic diagram of an exemplary meter suitable for practicing the present invention is shown. For purposes of explanation and example only, the meter of FIG. 2 is shown as an electrical utility meter for monitoring three-phase electrical power. However, the principles disclosed herein are applicable to other types of meters, electrical meters and otherwise.

In FIG. 2, the exemplary meter 100 is a meter intended to, among other things, measure power consumption by a load, not shown, connected to an electric utility, not shown. The exemplary meter 100 includes polyphase current sensors 70, 72 and 74 and polyphase voltage sensors 76, 78 and 80. The meter 100 further includes a conversion circuit 105, a processor or microcontroller 108, a memory circuit 110, a display 112, and a communication device, such as a transceiver 114. The conversion circuit 105 comprises a first multiplexer 116, a second multiplexer 118, a first analog-to-digital ("A/D") converter 122, a second A/D converter 124, and a digital signal processor ("DSP") 128. It will be noted that a three-phase electrical utility meter is given by way of example only. Those of ordinary skill in the art may readily adapt the inventive aspects of the disclosed embodiment to other types of meters, such as single phase or network meters.

The meter 100 further includes a power supply 133 that is configured to generate bias power for the conversion circuit 105, the controller 108, the memory circuit 110, the display 112, and the transceiver 114. Such a power supply 133 may suitably be a switched mode power supply circuit that converts line voltage received from one of the mains electrical power lines to suitable DC bias voltages. Such circuits are known to those of ordinary skill in the art.

The current sensors 70, 72 and 74 are each connected to receive signals indicative of the current flowing through one phase of a three phase power line (i.e., phase A, phase B, and phase C). The current sensors 70, 72 and 74 of the exemplary embodiment described herein preferably each include transformers (not shown in FIG. 2), which are advantageously situated to detect current on each respective phase of the power line. The current sensors 70, 72 and 74 are further connected to the conversion circuit 105 through the first multiplexer 116.

The voltage sensors 76, 78 and 80 are each connected to the respective phase of the power line (i.e., phase A, phase B, and phase C) to obtain a voltage measurement therefrom. To this end, the voltage sensors 76, 78 and 80 may suitably comprise high resistance voltage dividers. Alternatively, the voltage sensors 76, 78 and 80 may be potential transformers. The voltage sensors 76, 78 and 80 are further connected to the conversion circuit 105 through the second multiplexer 118.

The conversion circuit 105 is a circuit operable to receive polyphase voltage and polyphase current measurement signals and generate digital signals therefrom, the digital signals including a power consumption signal and voltage and current signals. In the exemplary embodiment described herein, the conversion circuit 105 comprises first and second multiplexers 116 and 118, respectively, the first and second A/Ds 122 and 124, respectively, and the DSP 128. The above listed components of the conversion circuit 105 may suitably be incorporated onto a single semiconductor substrate.

The controller 108 is operably configured to, and executes programming instructions to, receive the digital signals from the conversion circuit 105, monitor and record power consumption using the digital signals, and analyze the digital voltage and current measurement signals and associated phase angle data to determine whether one or more measurement errors is present. The controller 108 may suitably be, for example, a K0 series microcontroller available from NEC. However, the controller 108 may alternatively comprise any other suitable processing device or circuit. The controller 108 generally includes firmware, or in other words, an integrated memory into which programming instructions are stored. Alternatively, the programming instructions may be stored in the memory 110.

The memory 110 is configured to store data, and the controller 108 is configured to deliver data to the memory or retrieve data from the memory. As discussed above, the memory 110 may be a non-volatile memory.

Figure 3:
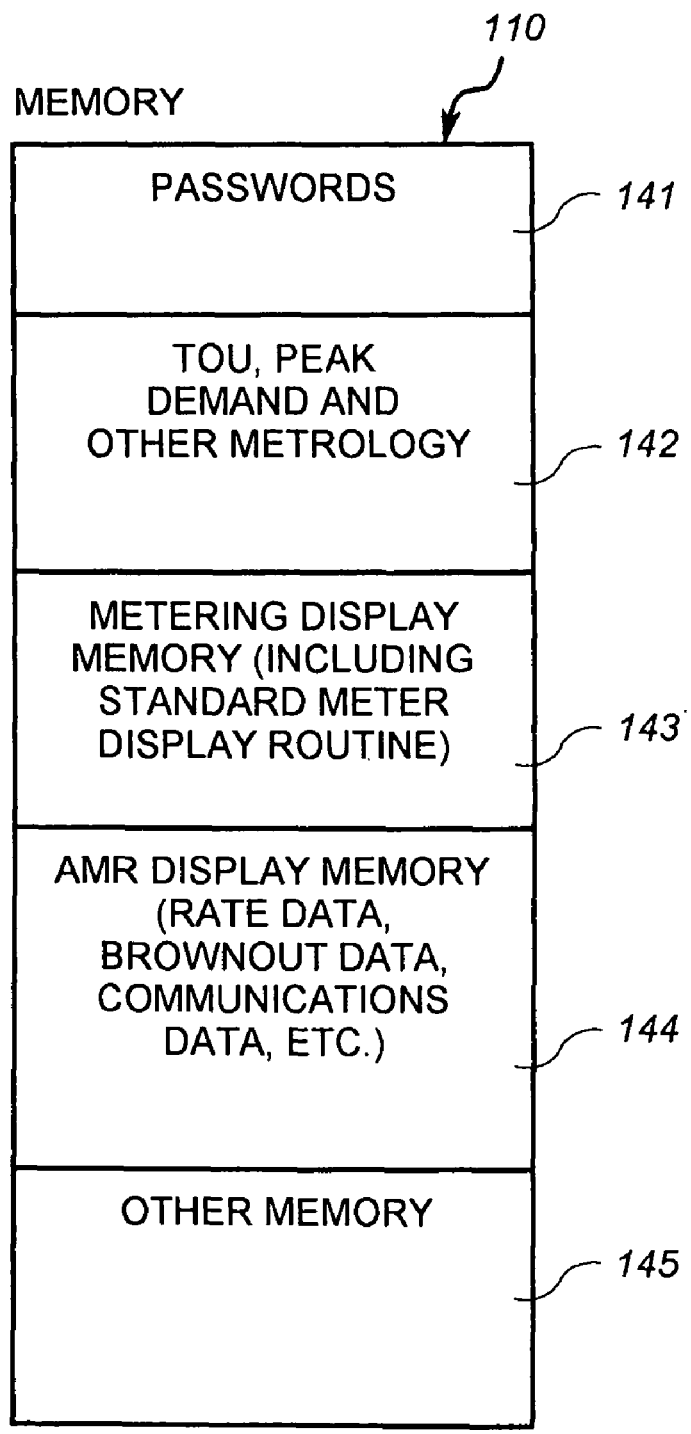
FIG. 3 shows an exemplary embodiment of the structure of the memory of FIG. 2.

With reference to FIG. 3, the memory 110 may be segmented with different memory segments 141-145 storing different types of data. Each segment of the memory is reserved for a particular user or purpose as set forth below.

A first segment 141 of the memory 110 is dedicated to the storage of passwords and associated memory segments. The contents of the memory 110 may only be accessed and/or modified upon presentation of a proper password that provides access to the particular memory location. In at least one embodiment, different passwords contained in the first segment are associated with one or more of the different memory segments. In this case, a user external to the meter 100 is only granted access to a memory segment upon entry of a password associated with that memory segment. Thus, a user's ability to read data from or write data to a given memory segment is dependent upon the user's password. For example, one or more first passwords may be granted to an automatic meter reading (AMR) company. Using the password(s), the AMR company would be allowed to read data from the AMR memory, write data to the AMR memory, or configure the AMR memory, as will be explained in further detail below with reference to the fourth memory segment 144. As a further example, the utility may also grant one or more second passwords to other meter parties, such as one or more second passwords for use by the customer where the meter is located. Such second passwords would allow the customer to obtain data from certain memory segments (e.g., the second segment 142) but block access to other memory segments (e.g., the fourth memory segment 144). The utility would also have its own set of third passwords that provide the utility with access to data in any segment of the memory or certain segments of the memory, depending on the access level of the password.

With continued reference to FIG. 3, a second segment 142 of the memory 110 is dedicated to metrology data, including various utility measurements taken by the meter 100 over a period of time. For example, in an electricity meter, the measurements may include time-of-use or peak demand measurements taken by the meter over the course of a billing cycle. Other examples of metrology data that may be stored in an electricity meter include kilowatt-hour measurements, reactive power measurements, power factor, pricing information, etc.

The meter 100 is configured to display the metrology data contained in the second segment 142 in different forms, depending upon the standard meter display routine configured by the user. Thus electronic display of the meter may be programmed to display different quantities, such as kilowatt-hours, VARs, VA, error codes, energy direction information, and the like, which data may be accessed from memory segment 142. Those of skill in the art will recognize that the above and other various types of meter data and configurations may be selected for display on the meter display. These various types and formats of data are generated within the meter and stored in the meter memory 110, and particularly meter segment 142. The user or a utility service person typically configures the meter to display only selected data from the meter memory 110 according to a standard meter display routine, as discussed below.

A third segment 143 of the memory 110 is dedicated to the meter display. The meter display memory segment 143 stores a standard meter display routine which is configured to display different types of data in differing formats depending on the display format desired by the customer or the utility. In at least one embodiment, the standard meter display routine comprises a series of messages, each displayed sequentially on the display 112. For example, the standard meter display routine may be configured to cycle the display between an instantaneous or current interval usage measurement and an aggregate usage measurement for a billing cycle. As an alternative example, the standard meter display routine may be configured to cycle the display between a billing category for the current interval, a total usage for the current interval, and a total energy consumption amount for the billing cycle. Accordingly, the standard meter display routine stored in the meter display segment 143 uses the data stored in the metrology segment 142 to provide the desired information to the meter display 110.

Another example of data that may be stored in the third segment 143 of the memory relates to different identifiers that are used in association with displayed quantities. These identifiers may be letters or numbers and are generally selected by the customer to indicate what is being shown on the display. Different identifiers are selected for a given standard meter display routine based on the customer's selected identifiers. One customer may choose to display letters to indicate a total energy consumption while another customer may choose to display a numeric code to indicate total energy consumption.

The standard meter display routine is programmed to display selected identifiers for the customer along with selected metrology data.

The differing identifiers and differing metrology data types are but two examples of different data that may be stored in the third segment 143 of the memory 110. At the time of initial meter configuration, the meter's standard meter display routine is configured to display only selected identifiers and selected metrology data from the meter memory. In one meter embodiment, the standard meter display routine is configured to show four different data identifiers and associated metrology data types/values which are selected from over one hundred different data types available in the meter memory. After the standard meter display routine is initially configured, it may be altered by the utility to display different data identifiers or metrology data types stored in the memory. In at least one embodiment of the meter disclosed herein, the standard meter display may be overridden or interrupted to display additional information provided from sources external to the meter and stored in other segments of the meter memory 110. This operation of overriding or interrupting the standard meter display routine is discussed in further detail below.

A fourth segment 144 of the memory 110 may be dedicated to memory for automatic meter reading (AMR). Data stored in this segment 144 may include information to be transmitted to an AMR device or information received from an AMR transmission device. Examples of data in this fourth segment 144 of the memory 110 include AMR data related to signal strength between the AMR remote communication device and the meter, AMR communications history, a meter address on the network used by the AMR, rate information from the AMR company, brownout data, etc. One of ordinary skill in the art will recognize that an AMR company may wish to receive and store numerous other types of data through the fourth segment 144 of the memory. In at least one embodiment of the meter disclosed herein, the fourth segment 144 of the meter memory 110 is exclusively available to the AMR company. The AMR company may read data from or write data to the fourth memory segment 144 upon entry of an appropriate password which is stored in the first segment of the memory and associated with the fourth segment of the memory. Such an embodiment is described in further detail below.

A fifth segment 145 of the memory 110 may be dedicated to the storage of additional information which is obtained from another source external to the meter after the meter is placed in the field. This additional storage segment 145 provides a quantity of memory that is exclusively available to a party other than the AMR company. For example, the fifth segment 145 may be exclusively available to the utility. As discussed in further detail below, data from a source external to the meter 110, such as the utility offices, may be received by the meter 110 at the transceiver 114. The additional storage segment 145 may be used to store the data received at the transceiver for later use by the meter, such as displaying a priority message on the meter display.

In at least one embodiment, as discussed above, access to the data in the various segments 141-145 of the memory 110 is only available for access by a user upon receipt of a proper password. For example, data in the fourth segment 144 may be exclusively available to an AMR company. However, before the AMR company may access the memory in the fourth segment, the AMR company must input a proper password. Depending upon the access level granted by the password, the AMR company may have access to certain other segments of memory also. Thus, if the AMR company is the billing company, receipt of the AMR password may also provide the AMR company with access to data in the second memory segment 142.

Figure 3A:
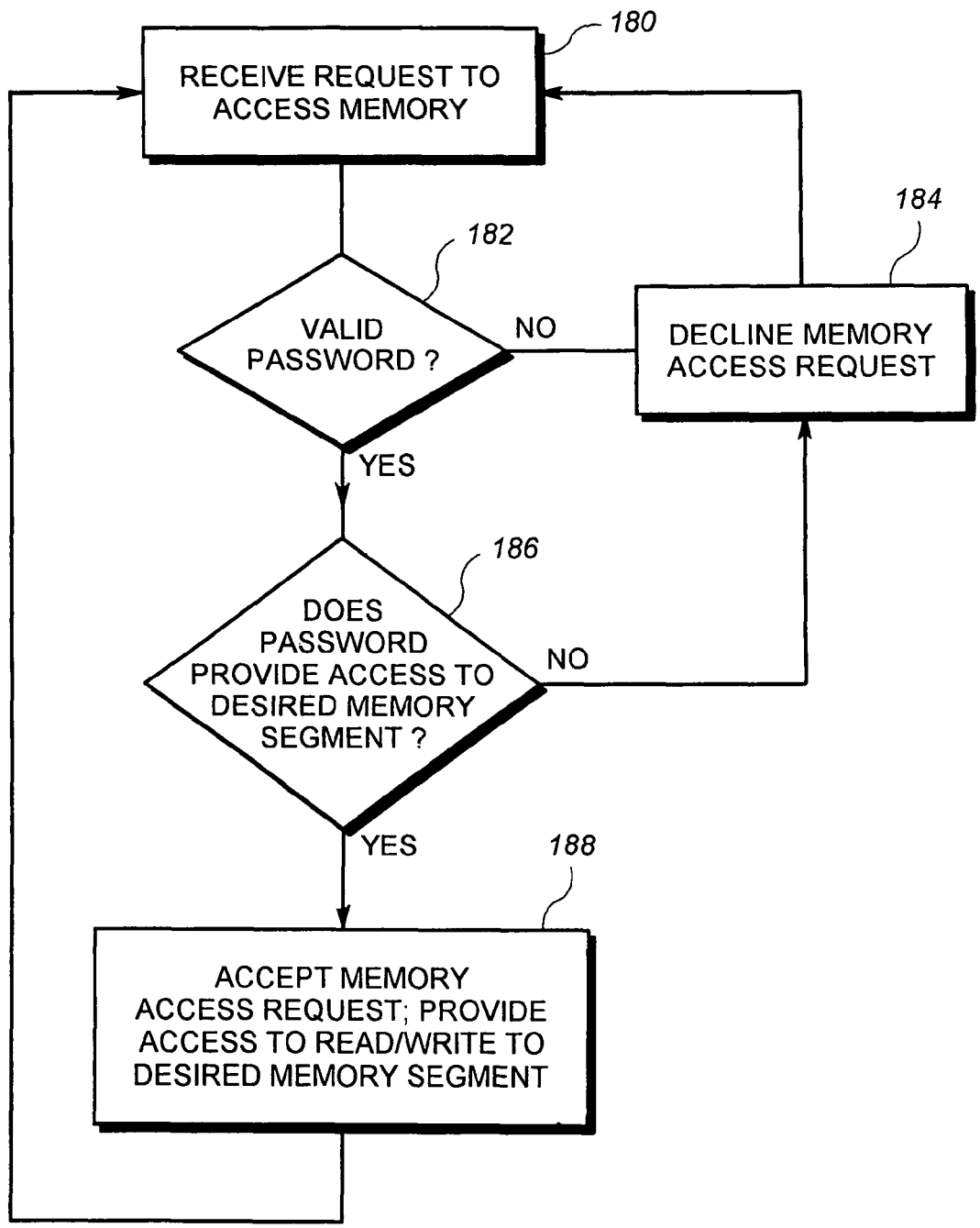
FIG. 3A shows an exemplary subroutine operated by the processor of FIG. 2 when a remote communication device requests access to the memory.

FIG. 3A provides an exemplary subroutine for determining if access to certain memory segments should be granted. According to the subroutine, a memory access request is received in step 180 accompanied by a password. In step 182 the subroutine compares the received passwords with the passwords stored in the first segment 141 of the memory. If the received password is not a valid password stored in the first segment 141 of the memory, an error notice is returned in step 184 denying access to the memory based on an invalid password. If the received password is a valid password, in step 186 the system then determines if the password received provides access to the requested memory segment (i.e., if the requested memory address is in a memory segment which the password is associated with). If the password does not provide access to the requested memory segment, an error notice is returned. On the other hand, if the password does provide access to the requested memory segment, the user is granted access to the memory in step 188, allowing the user to either read from or write to the requested memory section.

Returning again to FIG. 2, the transceiver 114 of the meter 100 is operable to transmit signals to and/or receive signals from a remote source outside of the meter. Such transceivers are known to those of ordinary skill in the art. In one embodiment, the transceiver 114 may be a combination RF transceiver and dual port memory device, sometimes known in the art as an RFID device.

In at least one embodiment, the transceiver 114 is operable to transmit meter data from the meter circuit to a remote device 30 (see FIG. 1), such as a computer at a distant utility facility. The transceiver 114 can also receive data transmitted from the remote device 30. In accordance with one embodiment, the processing device of the metering circuit may at least temporarily display information received from the remote device via the transceiver. The transceiver may comprise one or more separate communications devices configured to communicate with different remote sources, such as one communication device to communicate with the utility company and one communication device to communicate with the AMR company.

The meter 100 further includes a display 112. The display is an electrical display as commonly used in utility meters, such as the seven-segment or sixteen-segment LCD or LED display. These and other common displays for utility meters will be recognized by those of ordinary skill in the art. In one embodiment, the display 112 is comprised of a plurality of sections, such as a first section comprised of seven-segment display characters and a second section comprised of sixteen-segment display characters. Different types of data may be displayed in each of the sections of the display, such as identifiers in one section and associated numerical data in another section. The different segments may include different sized characters to assist the reader in quickly distinguishing one segment from another segment. Such multiple-section displays will also be recognized by those of ordinary skill in the art.

As discussed above, the display 112 is typically used to show metrology data, including usage information related to the utility meter. For example, in an electricity meter, usage information may include instantaneous demand metering, total interval usage, total billing period usage, current pricing per unit consumed, etc. However, situations may exist where it would be advantageous to override a meter's electronic display in order to convey information that is useful only for a particular instance, such as when a technician or meter reader will be at the meter's location. The content of the displayed data is dependent on the situation. The embodiment described herein can be used in these situations to update the meter's display.

In one example of a situation where a utility meter display may be overridden, consider an electricity meter that needs to be replaced, and further consider that the electricity meter is one of many similar meters in a bank of meters at an apartment complex. It would be advantageous to provide an indication on the meter display that a particular meter in the bank of meters is the meter that should be replaced. On the day that a utility crew is scheduled to replace the meter, the utility transmits a priority message that causes the subject utility meter to display a text message such as "SWAP OUT 07-25-2006". This priority message is not related to billing or pricing or consumption or other usage, but is instead designed to communicate a particular message to someone present at the meter using the meter display. The priority message is received by the meter at the transceiver 16, and is stored in the memory 110. In particular, the priority message is stored in the fifth segment 145 of the memory 110 specifically reserved for additional information received by the meter. After the message is stored in the memory 110, the processor 108 interrupts or overrides the standard meter display routine being operated by the meter, and instead displays the priority message on the meter display 112. In this case, the "SWAP OUT" message is displayed. This message provides a clear indication to the utility crew that this particular meter from the bank of meters is in need of replacement. Without the message, the utility crew would need to inspect each meter and look for a matching identifier (serial number or other identification string) on the meter's nameplate. The manual identification would be more time consuming and error prone than providing a priority message on the meter display.

Figure 4:
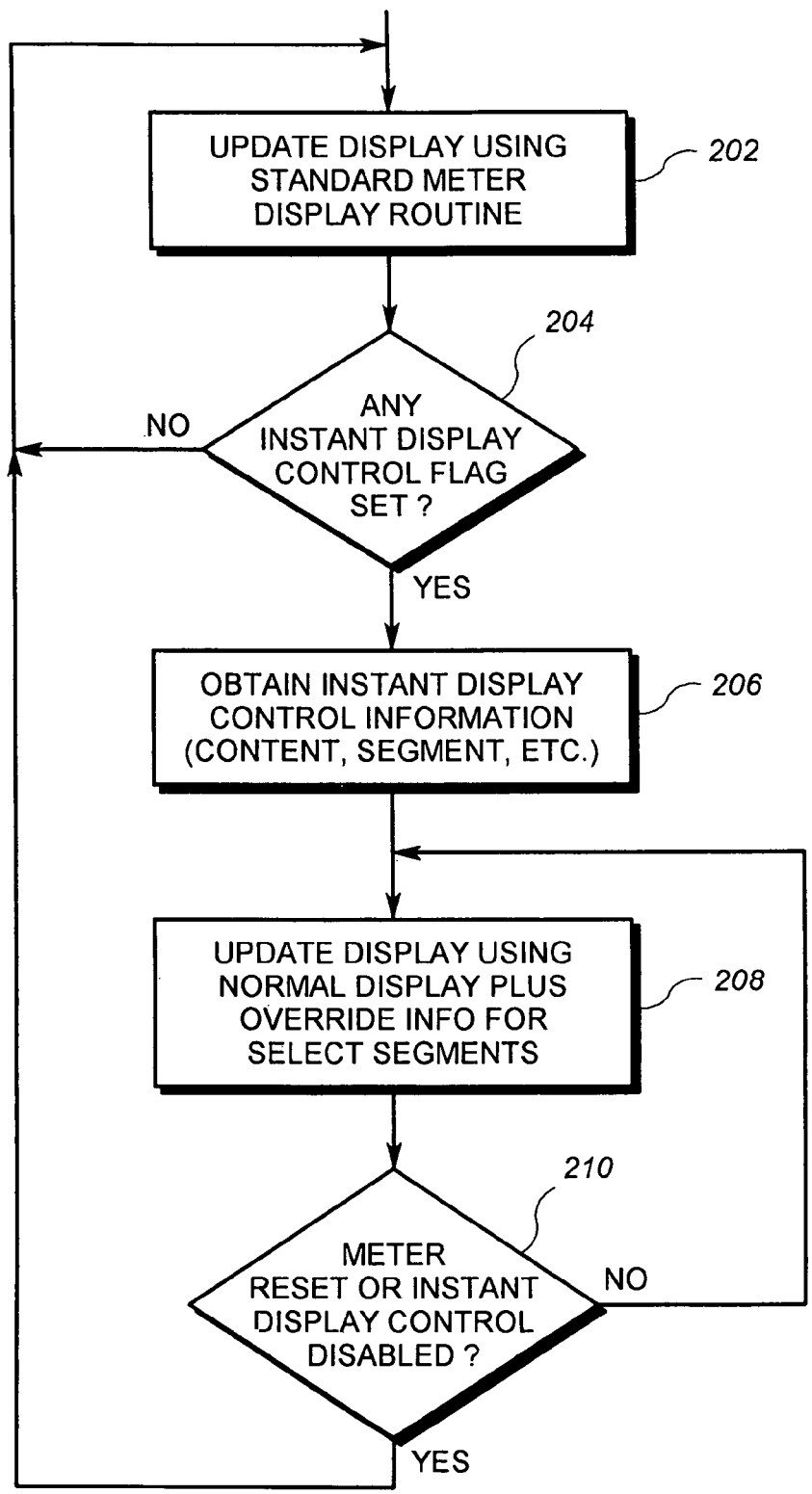
FIG. 4 shows an exemplary priority message routine operated by the processor of FIG. 2.

Referring now to FIG. 4, an exemplary priority message routine 200 operated by the processor 108 is shown. In a first step 202 of the priority message routine, the meter processor updates displays by executing its standard meter display routine. In the standard meter display routine, the meter processor typically consults a number of variables or memory addresses that identify data to be displayed, if at all, in the different segments of the display. The meter electronic display may have multiple segments indicating various types of information. For example, the display may include a display segment configured to show an energy consumption quantity (i.e. a meter usage value). In addition, the display may include a display segment showing the type of service and/or the voltage level. Furthermore, the display may include a predefined segment for error codes or messages generated within the meter. As yet another example, the display may also include a segment showing the direction of the flow of energy (to or from the load). All of the information to be displayed is suitably stored in select memory locations.

In step 204, the meter processor determines whether any flags for priority display control (or "instant" or "override" display control) have been received. If not, the meter processor returns to update the display per normal operation in step 202. If so, however, then the meter proceeds to step 206. In at least one embodiment, the priority flag is only set if a proper password has been received from the remote source wishing to override the display.

In step 206, the meter processor obtains the priority display information including (i) an identification of the information to be displayed, and (ii) the segment in which the information should be displayed. In some embodiments, more, less or different details regarding what is to displayed, where or how (which segments) it is to be displayed, and how long it is to be displayed, may be provided.

In step 208, the meter processor updates displays by executing its normal display routine, except that the information or text received in the "instant display information" (or "priority message") is displayed in the identified segment, instead of the normal information that is usually displayed there. Thus, the display may be the same as normal except for a select segment. Moreover, the information normally displayed in that segment may continue to be updated by the meter processor and even stored in the allocated memory. The instant (priority) display message just overrides the output to the display so that the information normally displayed in such display segment is replaced by the priority display information.

It is noted that the priority display information may be received from an optical communication port, or from a remote device (e.g., the remote source 30) via the transceiver 114. In the embodiment described further below, the priority information to be displayed in the override situation may be information received from a remote source and stored in a memory location allocated to another user or device. However, in other embodiments, the priority information may be directly received from the transceiver 114 and then displayed at the meter display 112. In yet other embodiments, the messages to be included in the display may be received from another source other than the metrology circuitry or a source external to the meter. For example, the messages to be included in the display may be received from an AMR board associated with the meter.

In step 210, the meter processor determines whether the meter has been reset, or whether the instant display control or override has been disabled. In this embodiment, these activities cancel the override.

If the answer in step 210 is "no", then the meter processor returns to step 106. If, however, the answer is "yes, then the meter processor returns to step 202 to restore the normal displays.

As discussed in the above embodiment, transmission of the priority message occurs from a remote location external to the utility meter, such as the offices of the utility. To this end, a software program is generally provided at the remote source which handshakes with a program in the meter. This allows the remote source (e.g., the utility offices) to input the priority message and transmit the message to the particular meter.

Screen shots from a computer running an exemplary program configured for input and transmission of a priority message are shown in FIGS. 5-10. The computer is running the priority message input program and also includes a transceiver which provides for communication with the meter 100. In this case, the computer is the remote source 30 shown in FIG. 1. In the embodiment of FIGS. 5-10, the computer is provided at the utility company's offices which are remote from the meter.

Figure 5:
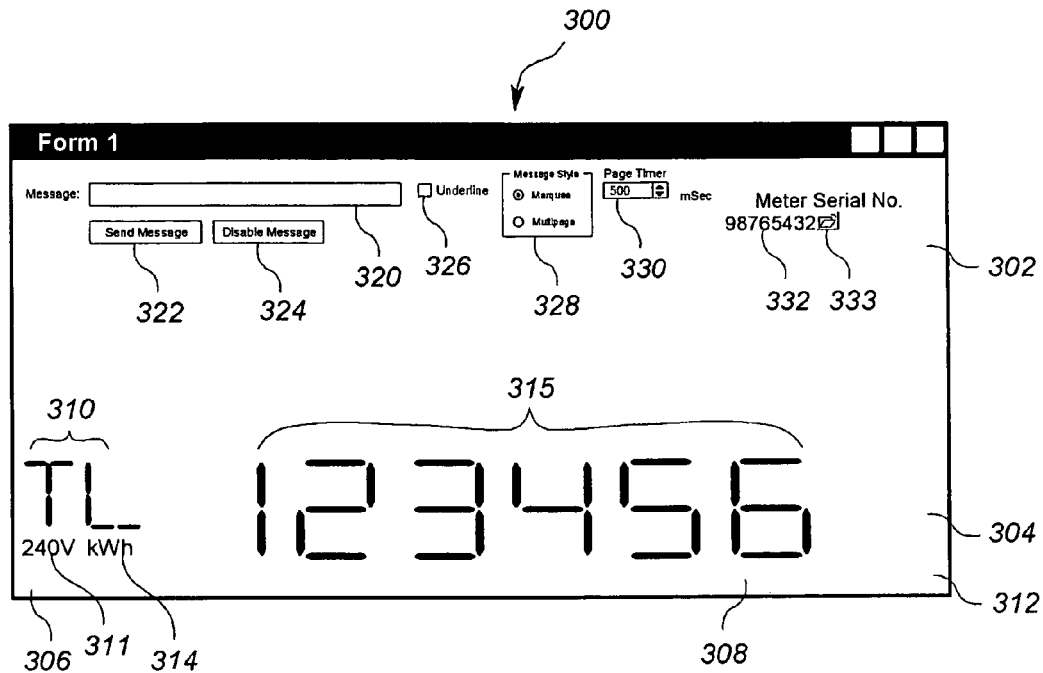
FIG. 5 shows an exemplary screen shots from a remote computer operating a priority message program.

As shown in FIG. 5, the screen 300 is split into an upper window 302 and a lower window 304. The upper window 302 provides various input options allowing the user to choose a specific utility meter, input a priority message for the specific utility meter, and transmit the message to the specific utility meter. The bottom window 304 provides a virtual view of the current utility meter display 312. In other words, the bottom window 304 shows the same data in the same form as currently shown on the actual selected meter display. This data from the meter 100 is delivered to the user's computer via the transceiver 114. As discussed above, the data is provided on the meter display according to a standard meter display routine.

The meter display 312 shown in the bottom window includes two sections, including a left section 306 and a right section 308. The left section 306 of the display is comprised of two sixteen segment electronic displays 310, a "240V" service level indicator 311, and a "kWh" indicator 312. The two sixteen segments displays 310 are configured to display a two character identifier related to a value shown in the right section 308 of the display. The right section of the display is comprised of six 7-segment electronic displays 314. In FIG. 5, the left section 306 of the display 312 shows the identifier "TL" which indicates that a total energy consumed is being displayed in the right section 308 of the display. The left section 306 further shows a level of service of "240V" and a unit measurement of "kWh". The right section 308 shows a total energy consumption measurement of "123456". Again, because the indicators "TL" 311 and "kWh" 314 are displayed in the left section 306 of the display, one viewing the measurement of "123456" will have an indication that this value is the total energy consumption in kilowatt-hours.

Figure 6:
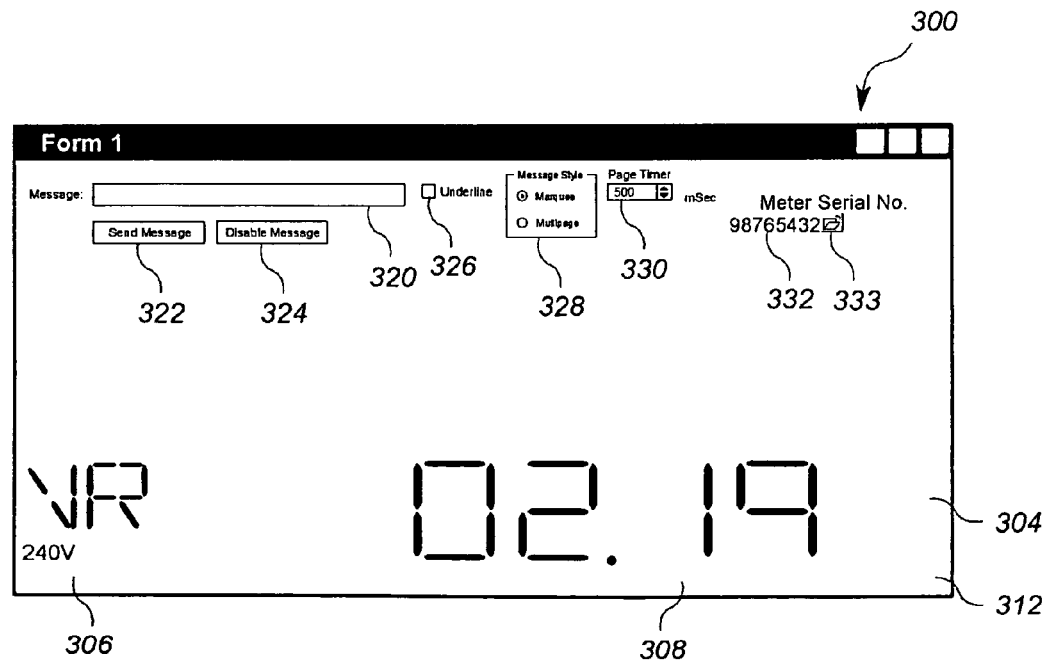
FIG. 6 shows an updated version of the screen shot of FIG. 5 following a change in an associated meter's display.

The display 312 is further configured to show additional information according to the standard meter display routine. For example, in the disclosed exemplary embodiment, the display cycles between a total energy consumption measurement, as shown in FIG. 5, and a firmware version display, as shown in FIG. 6. The display 312 shows the identifier "VR" in the left section 306, and "02.19" in the right section, indicating that the meter is equipped with firmware version 2.19. The meter display operates according to a standard meter display routine, causing the display to periodically switch (e.g., every five seconds) from the view of FIG. 5 to the view of FIG. 6, and vice-versa.

Figure 7:
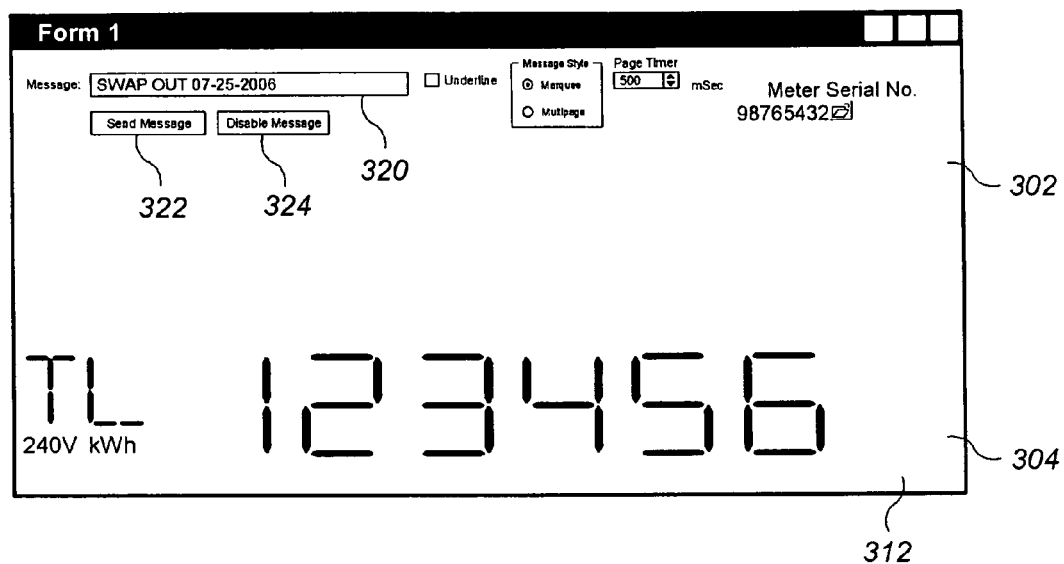
FIG. 7 shows the screen shot of FIG. 5 once a user has input a priority message in a priority message input box.

With reference now to the upper window 302 shown in FIGS. 5 and 6, the user at the remote location 30 is provided with the ability to interrupt or override the standard meter display routine in order to display a priority message on the meter display. Accordingly, the upper window 302 includes a message entry block 320. In order to input a message in the message entry block 320, the user simply moves the curser to the message entry block 320 and clicks on the block. The user then uses the computer's keyboard to type in a priority message. As shown in FIG. 7, the user has entered the message "SWAP OUT 07-25-2006" in the message entry block 320. However, the user has not yet chosen to send the message to the meter 100, so the lower window 304 continues to show the meter display according to the standard meter routine being implemented by the meter.

The upper window 302 also provides the user with various options for the priority message entered into the message entry block 320. For example, in box 326, the user may indicate whether the spaces in the priority message should be shown as underlines when displayed on the meter display. In box 328, the user selects whether the priority message should be displayed in marquee style or in multipage format on the meter display. In other words, for messages that are longer than the available spaces on the meter display, the user may indicate whether the message should scroll across the meter display in marquee fashion or be shown as a first page which is then removed and followed by at least one second page. The user simply selects the preferred method in box 328 for the priority message to be displayed in one of these formats. Box 330 provides a page timer. If the marquee format is selected, the length of time between incremental steps of message movement to the left is indicated in box 330. For example, a user may decide that each step of a marquee should be displayed for 500 ms before the next step is displayed. This timer data is input by the user in box 330 by either clicking the up/down arrows associated with the box or by clicking on the box and typing in a time value. If the multi-page format is selected in box 328, the input box 330 will determine the length of time a single page of a given message should be displayed.

Another option provided in the upper window 302 is the meter selection box 332. The meter selection box 332 allows the user to identify the particular meter where a priority message should be delivered. In order to identify the meter, the user clicks on this box and types in the desired meter's serial number. Alternatively, the user may use the serial number selection feature 333 associated with this box. This feature allows the user to scroll through various serial numbers which are grouped together, such as grouped together by location. For example, all serial numbers for meters at a particular apartment complex may be grouped in one file. This serial number selection feature also allows the user to select an entire group of serial numbers and send a priority message to the entire group for display on such meters.

After entering a priority message in the message entry block 320, the user selects the "send message" option 322 to have the message displayed on the selected meter. After clicking the "send message" option 322, the priority message is delivered to the meter and is displayed in the meter display 112, per the method described above with reference to FIG. 4. Once the priority message is received by the meter, the priority message is saved in the fifth segment 145 of the memory 110 (see FIG. 3). As mentioned previously, this segment of the memory is reserved for storage of additional information not associated with other memory segments, and may be available exclusively to the utility company.

Figure 8:
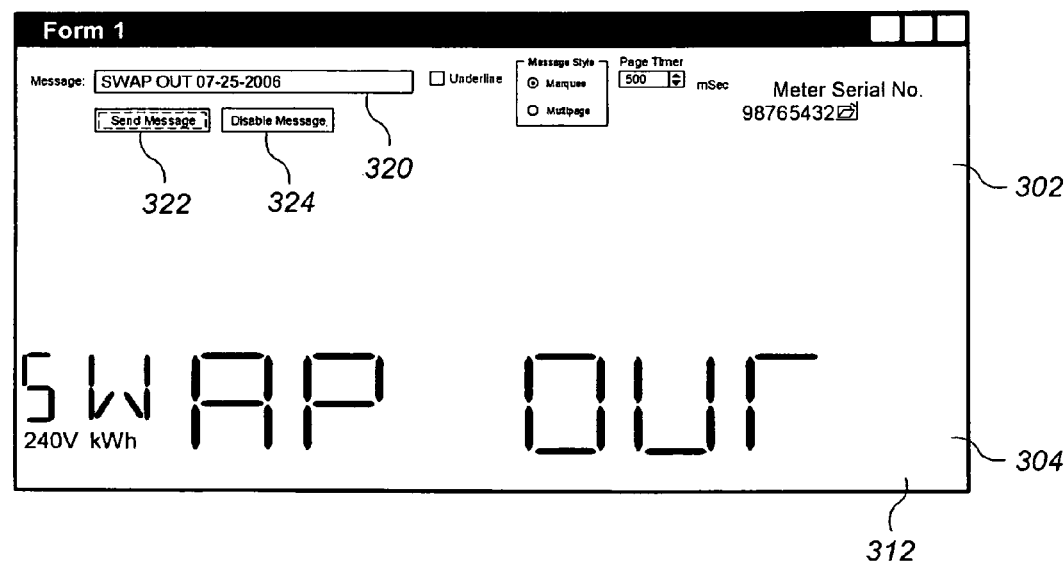
FIG. 8 shows the screen shot of FIG. 5 after the priority message has been sent to the associated meter.
Figure 9:
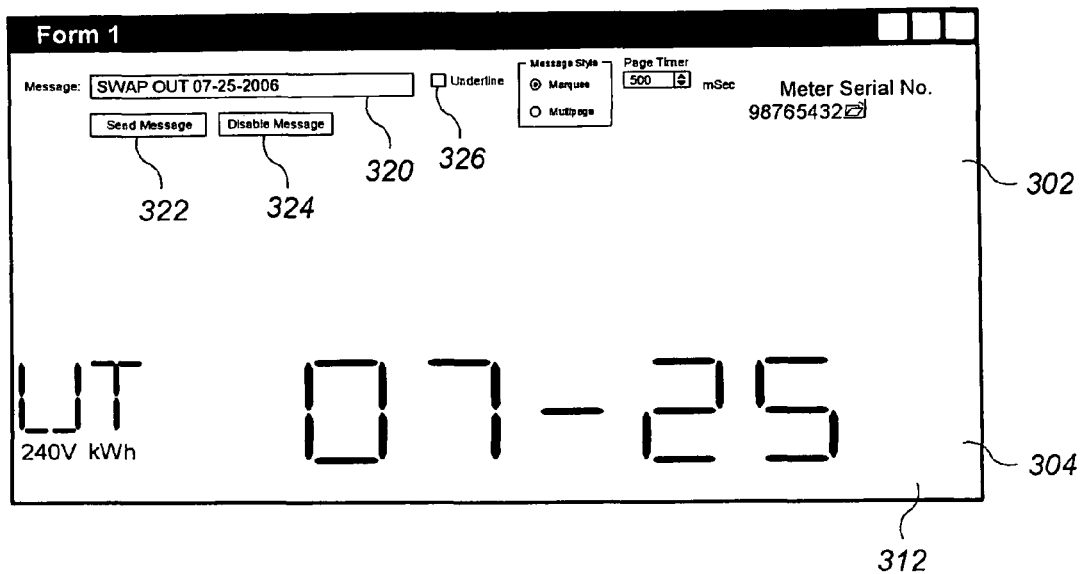
FIG. 9 shows an updated screen shot of FIG. 8 with the priority message scrolling across the screen.
Figure 10:
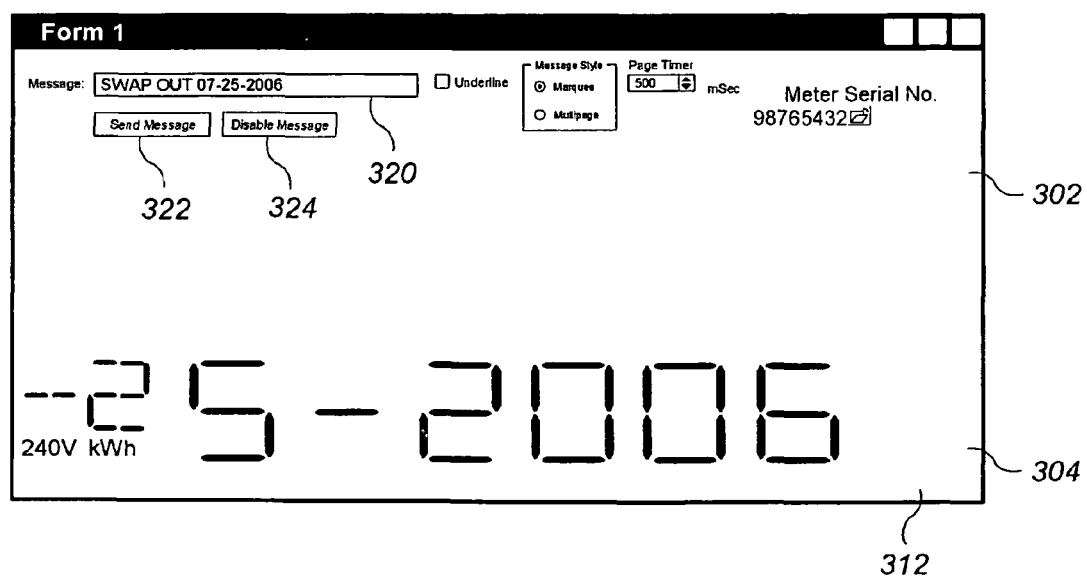
FIG. 10 shows yet another updated screen shot of FIG. 8 with the priority message scrolling across the screen.

When the priority message is received at the meter 10 from the remote source 30, the priority message is saved to the memory and the meter software or firmware sets a priority message flag (also referred to as an "instant display flag"). As explained above with reference to FIG. 4, after noting that the priority message flag is set, the meter retrieves the priority message from this memory segment 145 in order to display the message on the meter display. When the meter display 112 shows the priority message, it may also be displayed on the virtual display 312 at the remote source, as shown in FIG. 8. In the present example, the user has chosen to display the priority message in marquee fashion. FIGS. 8-10 show the "SWAP OUT 07-25-2006" message as it is displayed in various stages in marquee fashion. In FIGS. 8-10, the standard meter display routine has been overridden by the priority message, and the priority message is what is shown on the meter display.

When the user wishes to disable the priority message and return to the meter to the standard meter display routine, the user selects the "disable message" option 324 on the upper portion 302 of the screen. After clicking on the "disable message" option 324, the meter is reset or the priority message flag is removed, as described in FIG. 4. The meter then returns to the default/standard meter display routine and the priority message is no longer presented on the meter display. At the same time, the virtual meter display 312 on the lower portion 302 of the screen no longer shows the priority message, but returns to the data displayed during the standard meter display routine for the selected meter.

In at least one embodiment, the system may be configured to automatically disable the priority message after a given time. In such an embodiment, upon clicking the "disable message" option 324, the user is presented with an immediate disable option or a time-out disable option. With the time-out disable option, the user enters a time during which the priority message should be displayed. This time entered by the user specifies the time during which the priority message is displayed and a time at which the priority message is disabled. The time entered by the user may include a start time and an end time. The start time could be immediately or could be a future time, such as tomorrow or a day of the following week. The end time would be any time after the start time, allowing the priority message to be displayed for a few hours, a few days, or some other time period selected by the user.

In one alternative embodiment to the embodiment of the above paragraph, the meter 100 is configured with an automatic time-out for any procedures that override or interrupt the standard display routine. According to this embodiment, when an override or interrupt to the normal display routine is received (such as with a priority message), the meter begins a timer. If communication with the remote source is not re-affirmed or re-communicated (i.e., refreshed) before the timer reaches a time limit, the meter reverts to the default display/standard display routine. This embodiment provides a persistence timer associated with an override or interrupt of the standard meter display routine. The persistence timer requires the remote device to remain in communication with the meter or else the priority message (or other amended display) from the remote device will be automatically discontinued after a given time. Accordingly, when a remote device looses communication with the meter, the priority message (or other amended display) does not remain on the meter display indefinitely, but the meter is instead returns to normal operations following timeout when there is a loss of communication with the remote communication device.

In one alternative embodiment, the upper portion 302 of the screen provides the user with an option to present the priority message on only a portion of the meter display. This would allow the priority message to be displayed on one portion of the display while data is displayed according to the standard meter display routine the other portion of the meter display. For example, in the meter display of FIGS. 5-10, the priority message could be presented in marquee fashion on the left section 306 and meter data according to the standard meter display routine could be provided on the right section 308 of the display. In such an example situation, the meter would not display the standard identifiers in the left section 306, but the customer or meter reader familiar with the meter could still obtain a value from the right section 308 meter and deduct the units associated with this value based on his or her familiarity with the meter. Accordingly, even when a priority message is displayed at the meter, the meter could still be used to obtain readings. To accomplish this objective an option may be presented to the user in the upper portion 302 of the screen where the user may select a particular segment of the meter display in which to show the priority message (e.g., "display on left segment" or "display on right segment").

In at least one embodiment, the user must first enter a password before a priority message will be received in the memory for subsequent display, as discussed above in association with FIG. 3A. In this case, the password must match a password retained in the first memory segment 141 before access to the fifth memory segment 145 is granted. In this embodiment, the upper portion 302 of the screen may include a password input block. When the user clicks the "send message" option 322, the password is sent to the meter. If the password does not match one of the appropriate passwords for entry of priority messages, the message is denied, and the user is presented with a pop-up box on the upper portion 302 of the screen, indicating that the message was denied because of an invalid password. However, if the password does match, the priority message is written in the fifth segment 145 of the memory, the priority message control flag is set, and the meter displays the priority message for the designated time. The password may be sent as a memory request or other message instruction that includes the password, the priority message, and instructions for handling the priority message. Upon receipt of the message instruction, the meter controller determines whether the password is acceptable and grants access to the particular memory segment.

The foregoing examples anticipate populating the meter display with a priority message from the utility company, where the priority message was not present at the time of meter configuration. However, it will be recognized that numerous other exemplary situations will exist where the meter display might be populated with information from a remote source, wherein the information was not present at meter configuration and is not normally available or maintained within the meter device in its standard operation. For example, in a brownout situation, an AMR company may wish to indicate on the meter display that a brownout is occurring or will occur at a certain time. In this situation, the AMR company may deliver a memory request that include a message (e.g., "Brownout at 4:00 pm") to be written in the fourth segment 144 of the memory along with instructions to override or interrupt the normal meter display routine. Once the appropriate password is provided and the memory request is accepted, the message would be written to memory and the standard meter display routine would be interrupted to display the message. Other exemplary information that an AMR company may wish to present on the meter display includes information related to communication status (e.g., signal strength, connected, disconnected, etc.), test data, or a network address data. The AMR company may wish to display such information at different times and in different situations as will be recognized by those in the art.

In addition to displaying messages from remote sources, the memory requests and associated instructions received from the remote source may indicate that the standard display routine should show other data present in the meter, but not normally shown on the display. For example, if a meter records remote communication information such as signal strength information with a remote source or connection status information with a remote source, the memory request may include an instruction to retrieve this information from memory and display it on the meter for viewing by AMR personnel present at the meter location.

Numerous other examples exist of information that could be provided at the meter display using the meter arrangement disclosed above. For example, by virtue of the bi-directional communication capabilities of the meter and the remote device, information concerning the utility system in general could be presented at the meter display, including information on the health and status of local or system-wide communication equipment. Further, the bi-directional communication capabilities of the meter could allow meter data functions and calculations to be outsourced to a processor external to the meter, and processed data and calculations could then be returned to the meter for display.

In accordance with the above disclosure, it will be recognized that various components of the meter disclosed herein may be independently useful but may also have synergistic effect when combined, including:

a metering device memory available for reading and/or configuration by password level protection which is available to each of the metering device and the communication device;

a metering device memory available for reading and/or configuration by password level protection that is limited to a subset of the metering device's memory, only available to the utility owner or meter owner;

metering device memory available for reading and/or configuration by password level protection that is limited to a subset of the metering device's memory, only available to the AMR company or AMR devices or systems;

the ability for the metering device display to visually display status and communication status information contained in the metering devices memory, for example, if the AMR has access to certain memory locations and the metering circuit has access to others, the metering device could display information on either depending on configuration and/or override signals similar to those describe above in connection with the figures;

the ability of the metering device display to be programmed with a "persistence" timer that will reset the display to default (i.e. normal metering displays) if the overriding device (e.g. the AMR or communication device) does not update the display; such a display time-out assures that if the communication device data has expired and the device becomes incommunicative that the meter will automatically reset the display to a valid value;

the ability of the system to populate the meter's display with information from a remote source, which information is not generally available or maintained within the metering device.

Although the present invention has been described with respect to certain preferred embodiments, it will be appreciated by those of skill in the art that other implementations and adaptations are possible. Moreover, there are advantages to individual advancements described herein that may be obtained without incorporating other aspects described above. Therefore, the spirit and scope of the appended claims should not be limited to the description of the preferred embodiments contained herein.

What is claimed is:

1. A utility meter comprising:
    a measurement circuit configured to measure consumption and provide consumption data;
    a memory configured to store meter data including the consumption data, the memory comprising a plurality of memory segments, each of the plurality of memory segments protected by a different password;
    a receiver configured to receive a memory request and an associated password from a source external to the measurement circuit;
    a controller configured to grant or deny the memory request depending upon the associated password received from the source external to the measurement circuit;
    a meter display configured to display the meter data according to a standard meter display routine; and
    wherein the controller is configured to interrupt or override the standard meter display routine responsive to acceptance of the memory request, the memory request including an associated display instruction that is different from the standard meter display routine.

2. The utility meter of claim 1 wherein the display instruction includes an instruction to display data received from the source external to the measurement circuit.

3. The utility meter of claim 1 wherein the display instruction includes an instruction to display data already stored in the memory.

4. The utility meter of claim 3 wherein the data already stored in the memory includes remote communication information.

5. The utility meter of claim 1 wherein the controller is configured to return to the standard meter display routine following a predetermined time after communication with the source external to the measurement circuit ends.

6. The utility meter of claim 1 wherein metrology data is stored in one segment of the plurality of memory segments.

7. The utility meter of claim 1 wherein AMR data is stored in one segment of the plurality of memory segments.

8. The utility meter of claim 1 wherein the source external to the measurement circuit is a source external to the utility meter.

9. The utility meter of claim 1, wherein the controller is further configured to write information relating to the associated display instruction in a memory segment corresponding to the associated password of memory request.

10. The utility meter of claim 1, wherein the measurement circuit includes polyphase voltage sensors and polyphase current sensors.

11. The utility meter of claim 1, wherein the memory comprises a non-volatile memory.

12. The utility meter of claim 1, wherein the memory further comprises a memory circuit.

13. A utility meter comprising:
    a measurement circuit configured to measure consumption and provide consumption data;
    a memory configured to store meter data including the consumption data, the memory comprising a plurality of memory segments, each of the plurality of memory segments protected by a different password;
    a receiver configured to receive a memory request and an associated password from a source external to the measurement circuit;
    a controller configured to grant or deny the memory request depending upon the associated password received from the source external to the measurement circuit;
    a meter display configured to display the meter data according to a standard meter display routine;
    wherein the memory comprises an additional memory segment storing all of the passwords associated with the plurality of memory segments; and wherein the controller is configured to interrupt or override the standard meter display routine when the memory request is accepted and the memory request includes an associated display instruction that is different from the standard meter display routine.

14. A method of operating a utility meter, the method comprising:
    a) providing a memory including a plurality of memory segments, wherein each of the plurality of memory segments is associated with a different password;
    b) receiving a request for access to one of the plurality of memory segments at the utility meter from a source external to the utility meter, wherein the request for access to one of the plurality of memory segments includes an associated password, wherein the request for access to one of the plurality of memory segments includes an associated display instruction that is different from a standard meter display routine;
    c) accepting or denying the request for access to one of the plurality of memory segments depending on the associated password;
    d) interrupting or overriding the standard meter display routine in order to executed the associated display instruction if the memory request is accepted.

15. The method of claim 14 further comprising the step of returning to the standard meter display routine after a predetermined time.

16. The method of claim 14 wherein the associated display instruction includes an instruction to display data already stored in the memory.

17. The method of claim 16 wherein the data already stored in the memory includes remote communication information.

18. The method claim 14 wherein passwords associated with the plurality of memory segments are stored in one segment of the plurality of memory segments.

19. The method of claim 14 wherein metrology data is stored in one segment of the plurality of memory segments.

20. The method of claim 14 wherein AMR data is stored in one segment of the plurality of memory segments.

* * * * *